US008674444B2

(12) United States Patent
Yang et al.

(10) Patent No.: US 8,674,444 B2
(45) Date of Patent: Mar. 18, 2014

(54) STRUCTURE AND METHOD OF FORMING A TRANSISTOR WITH ASYMMETRIC CHANNEL AND SOURCE/DRAIN REGIONS (75) Inventors: Haining S. Yang, Wappingers Falls, NY (US); Kangguo Cheng, Schenectady, NY (US); Robert Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/422,297

(22) Filed: Mar. 16, 2012

(65) Prior Publication Data
US 2012/0235236 A1    Sep. 20, 2012

Related U.S. Application Data (62) Division of application No. 12/351,263, filed on Jan. 9, 2009, now Pat. No. 8,232,150.

(51) Int. Cl.
*H01L 27/12* (2006.01)
(52) U.S. Cl.
USPC ............ 257/347; 257/E29.255; 257/E21.409; 438/164; 438/286

(58) Field of Classification Search
USPC ............ 257/387, E21.44; 438/286; 297/387, 297/E21.44
See application file for complete search history.

(56) References Cited

U.S. PATENT DOCUMENTS

| 6,168,999 | B1 | 1/2001 | Xiang et al. |
| 6,660,596 | B2 | 12/2003 | Adkisson et al. |
| 6,744,083 | B2 | 6/2004 | Chen et al. |
| 2002/0140033 | A1 | 10/2002 | Bae et al. |
| 2006/0255415 | A1* | 11/2006 | Freeman et al. ............... 257/408 |
| 2008/0179636 | A1 | 7/2008 | Chidambarrao et al. |
| 2009/0200604 | A1 | 8/2009 | Chidambarrao et al. |

* cited by examiner

*Primary Examiner* — Sonya D. McCall-Shepard
(74) *Attorney, Agent, or Firm* — L. Jeffrey Kelly; Matthew Zehrer (57) ABSTRACT

A semiconductor structure includes a semiconductor substrate. A conductive gate abuts a gate insulator for controlling conduction of a channel region. The gate insulator abuts the channel region. A source region and a drain region are associated with the conductive gate. The source region includes a first material and the drain region includes a second material. The conductive gate is self-aligned to the first and the second material.

22 Claims, 8 Drawing Sheets

STRUCTURE AND METHOD OF FORMING A TRANSISTOR WITH ASYMMETRIC CHANNEL AND SOURCE/DRAIN REGIONS

CROSS-REFERENCE TO RELATED APPLICATION

This application is a divisional of U.S. patent application Ser. No. 12/351,263, filed on Jan. 9, 2009, now U.S. Pat. No. 8,232,150 the subject matter of which is incorporated herein by reference in its entirety.

BACKGROUND OF THE INVENTION

1. Technical Field

The present disclosure relates generally to semiconductor devices and their fabrication. In particular, the present disclosure relates to a transistor having asymmetric channel and source/drain regions, where the source and the drain of the transistor comprise different semiconductor materials.

2. Description of Related Art

The need to remain cost and performance competitive in the production of semiconductor devices has resulted in continuous decrease in device scale in integrated circuits. As CMOS devices scale, device to device variation increases dramatically due to, inter alia, dopant fluctuation and process variations. In particular, a major challenge is the improvement of the drive current without, for example, degrading the short channel performance. While strained $Si_{1-x}Ge_x$ leading to current improvements has been described in the prior art, key challenges persist. For example, the short channel effects and off state leakage current are degraded due to the smaller band gap in the $Si_{1-x}Ge_x$ layer.

Thus, the increased device mismatch significantly impacts SRAM stability. In light of the aforementioned difficulties of maintaining SRAM stability, it would be desirable to provide a novel structure and methods of improve SRAM stability and minimum operating voltage (Vmin) of SRAM. Accordingly, the present disclosure is directed to providing an improved transistor having asymmetric channel as well as source/drain regions.

SUMMARY OF THE INVENTION

The present disclosure is directed to a structure and methods of forming a transistor having asymmetric source/drain. In one embodiment, a semiconductor structure is described. The structure includes a semiconductor substrate; a conductive gate abutting a gate insulator for controlling conduction of a channel region, wherein the gate insulator abuts the channel region; and a source region and a drain region associated with the conductive gate, wherein the source region includes a first material and the drain region includes a second material, and wherein the conductive gate is self-aligned to the first and the second material. In one embodiment, the first material includes a SOI layer and the second material includes a SiGe layer. In another embodiment, the first material includes a SiGe layer and the second material includes a SOI layer. In yet another embodiment, the first material and the second material are selected from a group consisting of Si, SiGe and a combination thereof. The semiconductor structure further includes an asymmetric transistor formed over the semiconductor substrate, wherein the source region and the drain region are associated with the asymmetric transistor. In one embodiment, the asymmetric transistor is a field effect transistor. In another embodiment, the channel region is asymmetrical in profile between the source region and the drain region. The semiconductor substrate may include a semiconductor-on-insulator (SOI) layer, a buried insulating (BOX) layer and substrate layer.

In another preferred embodiment, an asymmetric transistor is described. The asymmetric transistor is formed in a semiconductor substrate having a semiconductor-on-insulator (SOI) layer, a buried insulating (BOX) layer and a substrate layer. The asymmetric transistor includes: a SiGe layer formed adjacent to a portion of the SOI layer; a channel region formed over the SOI layer and being associated with the asymmetric transistor; and a conductive gate formed over the channel region; and a source region and a drain region formed adjacent to either side of the channel region, wherein the source region is formed in at least one of the SOI layer and the SiGe layer and the drain region is formed in at least one of the SOI layer and the SiGe layer, and wherein the conductive gate is self-aligned to the SOI layer and the SiGe layer. In one particular embodiment, the asymmetric transistor further includes a gate insulator formed between the channel region and the conductive gate. In another embodiment, the source region is formed in the SOI layer and the drain region is formed in the SiGe layer. Alternatively, the source region may be formed in the SiGe layer and the drain region is formed in the SOI layer. In addition, the source region and the drain region may each include material selected from a group consisting of Si, SiGe and a combination thereof. Moreover, the asymmetric transistor is a field effect transistor.

In another preferred embodiment, a semiconductor device including a field effect transistor is described. The field effect transistor includes: a channel formed in a first portion of a SOI layer of a semiconductor substrate; a metal gate disposed above the channel; and a source region and a drain region formed on a portion of the SOI layer and in a recess at each end of the channel; wherein the source region includes a first material; and wherein the drain region includes a second material, and wherein the metal gate is self-aligned to the first and the second material. The first material may include Si and the second material includes SiGe. Alternatively, the first material includes SiGe and the second material includes Si. In addition, the first material and the second material may be selected from a group consisting of Si, SiGe and a combination thereof. In one particular embodiment, each of the source region and drain region are aligned to the metal gate and the channel.

A method of forming a semiconductor structure is also described. In one embodiment, the method includes forming a pad layer on a top surface of a SOI layer of a semiconductor substrate; patterning the pad layer and a portion of the SOI layer; epitaxially growing a SiGe layer on a sidewall of the SOI layer to form a SiGe layer adjacent to a sidewall of the SOI layer; selectively pulling a portion of the pad layer; forming a gate dielectric on a portion of the SiGe layer and the SOI layer; forming a gate conductor on a sidewall of the pad layer over the gate dielectric; removing the remaining of the pad layer; forming a spacer adjacent to the sidewalls of the gate conductor; and forming a source and drain region in at least one of the SOI layer and the SiGe layer. The source region is formed in the SOI layer and the drain region is formed in the SiGe layer. In one embodiment, the source region is formed in the SiGe layer and the drain region is formed in the SOI layer. Alternatively, the source region and the drain region are formed between a thin channel formed in a portion of the Si layer and the SiGe layer. In one particular embodiment, the source region and the drain region are aligned to the gate conductor.

In another embodiment, the method of forming a semiconductor structure includes: forming a semiconductor substrate having a semiconductor-on-insulator (SOI) layer, a buried insulating (BOX) layer and substrate layer; forming a pad layer on a top surface of the SOI layer; patterning the pad layer and a portion of the SOI layer for exposing a sidewall portion of the SOI layer; epitaxially growing SiGe over the sidewall portion of the SOI layer; selectively pulling a portion of the pad layer; forming a gate dielectric of a portion of the SOI layer and the SiGe layer; forming a gate conductor on sidewall of the pad layer and over the gate dielectric, wherein the gate conductor is formed over the Si region of the SOI layer; removing the remaining of the pad layer; and forming a source extension and a drain extension in the SOI layer and the SiGe, wherein the source extension and the drain extension contain different materials. In one particular embodiment, the step of forming a filling material is a self-limiting process, wherein the filling material forms a poly spacer on a sidewall of the BOX layer.

In yet another embodiment, a method of forming a semiconductor device formed over a semiconductor substrate is described. The method includes: epitaxially growing a SiGe layer in a portion of a semiconductor-on-insulator (SOI) layer of the semiconductor substrate; and forming a transistor over the SOI layer. The step of forming of the transistor includes: forming a channel region in a first portion of the SOI layer; forming a metal gate above the channel region; and forming a source region and a drain region formed between the channel region; where the source region is formed in at least one of the SOI layer and the SiGe layer; and further wherein the drain region is formed in at least one of the SOI layer and the SiGe. In one particular embodiment, the source region is formed in the SOI layer and the drain region is formed in said SiGe layer. Alternatively, the source region is formed in said SiGe layer and the drain region is formed in the SOI layer.

Other features of the presently disclosed structure and method of forming a transistor having asymmetric source/drain will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming a transistor having asymmetric source/drain regions will be described herein below with references to the figures, wherein.

DETAILED DESCRIPTION

Referring now to the drawing figures, wherein like references numerals identify identical or corresponding elements, an embodiment of the presently disclosed structure and method of forming a transistor having asymmetric source/drain regions, will be described in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the disclosure. Thus, the materials described herein are employed to illustrate the disclosure in one application and should not be construed as limiting.

FIGS. 1-7 illustrate a structure and method of forming a transistor having asymmetric source/drain regions. In particular, the structure includes a semiconductor substrate having a source region and a drain region, a conductive gate abutting a gate insulator for controlling conduction of a channel region, and a source region and a drain region associated with the conductive gate, where the source region includes a first material and the drain region includes a second material. In one embodiment, the first material includes a SOI layer and the second material includes a SiGe layer. The method includes forming a pad layer on a top surface of a SOI layer of a semiconductor substrate; forming a pad layer on a top surface of a SOI layer of a semiconductor substrate; patterning the pad layer and a portion of the SOI layer for forming a SiGe layer; epitaxially growing the SOI layer for forming a Si layer and a SiGe layer adjacent to a sidewall of the SOI layer; selectively pulling a portion of the pad layer; forming a gate dielectric of a portion of the SiGe layer and the SOI layer; forming a gate conductor over the gate dielectric; removing the remaining of the pad layer; forming a source region in at least one of the SOI layer and the SiGe layer; and forming a drain region in at least one of the SOI layer and the SiGe layer. In one embodiment, the source region is formed in the SOI layer and the drain region is formed in the SiGe layer.

Figure 1:
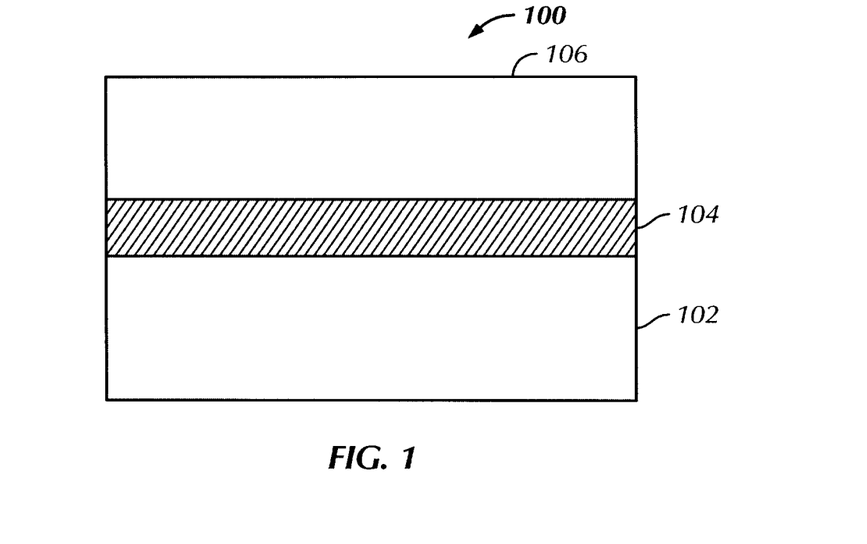
FIGS. 1-7 illustrate simplified cross-sectional views of progressive stages of a method of forming a transistor having asymmetric source/drain regions, in accordance with one embodiment of the present disclosure.

With initial reference to FIG. 1, an embodiment of a semiconductor-on-insulator (SOI) wafer, in accordance with the present disclosure, is illustrated and is designated generally as SOI wafer 100. SOI wafer 100 includes a handle substrate or base semiconductor substrate 102; a buried insulator (e.g. buried oxide (BOX)) layer 104 formed on base semiconductor substrate 102; and a SOI layer 106 formed on BOX layer 104, where BOX layer 104 isolates SOI layer 106 from base semiconductor substrate 102.

Base semiconductor substrate 102 may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, base semiconductor substrate 102 may be about, but is not limited to, several hundred microns thick. For example, base semiconductor substrate 102 may include a thickness ranging from about 0.5 mm to about 1.5 mm.

Buried insulator (BOX) layer 104 may include, for example, silicon oxide. BOX 104 may also be formed from any of several dielectric materials. Non-limiting examples include, for example, oxides, nitrides and oxynitrides of silicon. Other dielectric materials such as high-k dielectric materials which have a dielectric constant greater than 7 are also envisioned. In addition, BOX layer 104 may include crystalline and/or non-crystalline dielectric material. Furthermore, BOX layer 104 may include a single or multiple layers. BOX layer 104 may be formed using any of several methods. Non-limiting examples include ion implantation methods, thermal or plasma oxidation or nitridation methods, chemical vapor deposition methods and physical vapor deposition methods. Typically, BOX layer 104 includes an oxide of the semiconductor from which base semiconductor substrate 102 is comprised. In one embodiment, BOX layer 104 includes a thickness of about 300 nm. Alternatively, BOX layer 104 may include a thickness ranging from about 10 nm to about 500 nm.

SOI layer 106 may include any of the several semiconductor materials included in base semiconductor substrate 102. In general, base semiconductor substrate 102 and SOI layer 106 may include either identical or different semiconductor materials with respect to chemical composition, dopant concentration and crystallographic orientation. In one particular embodiment of the present disclosure, base semiconductor substrate 102 and SOI layer 106 include semiconductor materials that include at least different crystallographic orientations. Typically one of base semiconductor substrate 102 and SOI layer 106 includes a {110} crystallographic orientation and the other of base semiconductor substrate 102 and SOI layer 106 includes a {100} crystallographic orientation. Typically, SOI layer 106 includes a thickness ranging from about 5 nm to about 100 nm.

Figure 2:
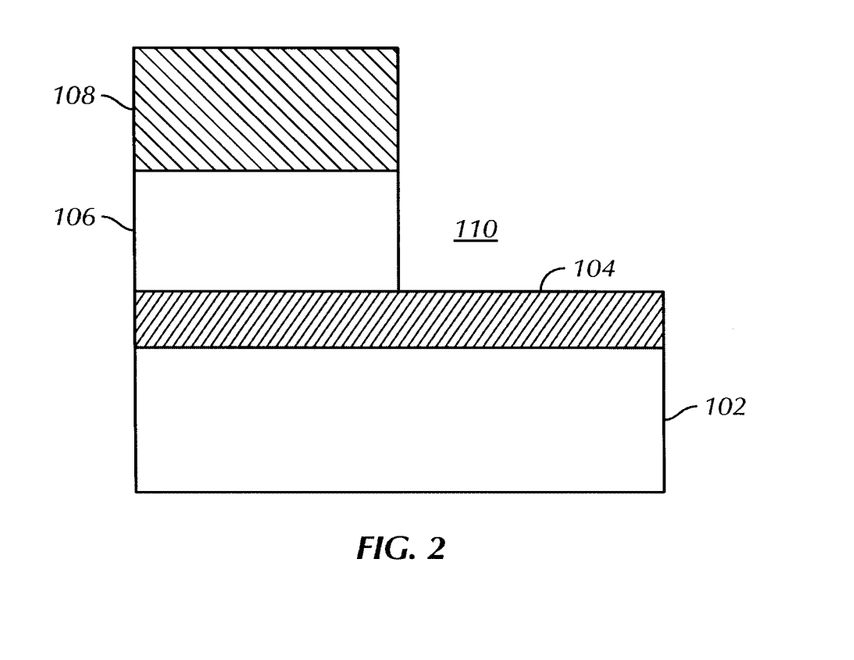

With reference to FIG. 2, a pad layer 108 is formed on a top surface of SOI layer 106. Pad layer 108 includes an insulating material such as, for example, silicon nitride. Pad layer 108 may be formed using conventional lithographic patterning methods, for example, low-pressure chemical vapor deposition (LPCVD) and depositing SiN of a thickness ranging from about 10 nm to about 500 nm. In one particular embodiment, pad nitride layer 108 includes a thickness of about 100 nm. Optionally, a thin (2 nm to 10 nm, preferably 5 nm) thermal oxide layer (not shown) may be formed on SOI layer 106 prior to forming pad nitride layer 108.

With continued reference to FIG. 2, a hardmask layer (not shown) having a suitable masking material is deposited on pad layer 108 and patterned using a conventional photolithography techniques. In particular, pad layer 108 and SOI layer 106 are patterned using standard lithography steps followed by, for example, an anisotropic dry etch technique, such as reactive ion etching (RIE) process for selectively etching a portion of SOI layer 106 and pad layer 108 for forming a trench 110, as shown in the figure. In particular, it is noted that trench 110 exposes a portion of BOX layer 104.

Figure 3:
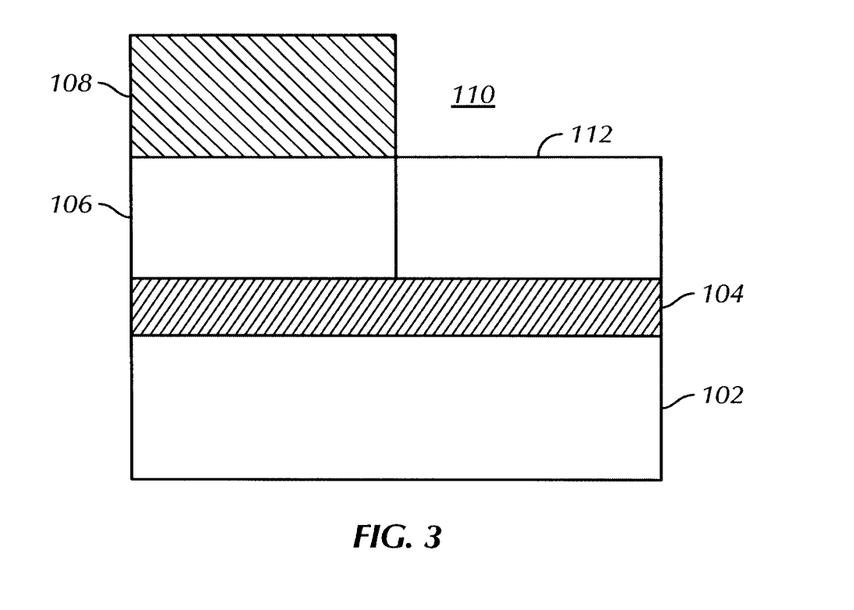

With reference to FIG. 3, a stress material (e.g. SiGe) 112 is epitaxially grown in trench 110, such as, for example, a highly selective epitaxial SiGe layer 112, fully filling etched region 110. SiGe layer 112 may be grown to a thickness of about 10 nm to 100 nm thick, although other thicknesses are also contemplated. For example, SiGe layer 112 may be grown to a thickness similar to that of SOI layer 106, as shown in the FIG. 3. In one embodiment, the SiGe layer 112 can be in-situ doped (i.e. doping during epitaxial growth). Alternatively, SiGe layer 112 is doped after the epitaxial growth, for example, by ion implantation, plasma doping, and/or any other suitable doping techniques.

Figure 4:
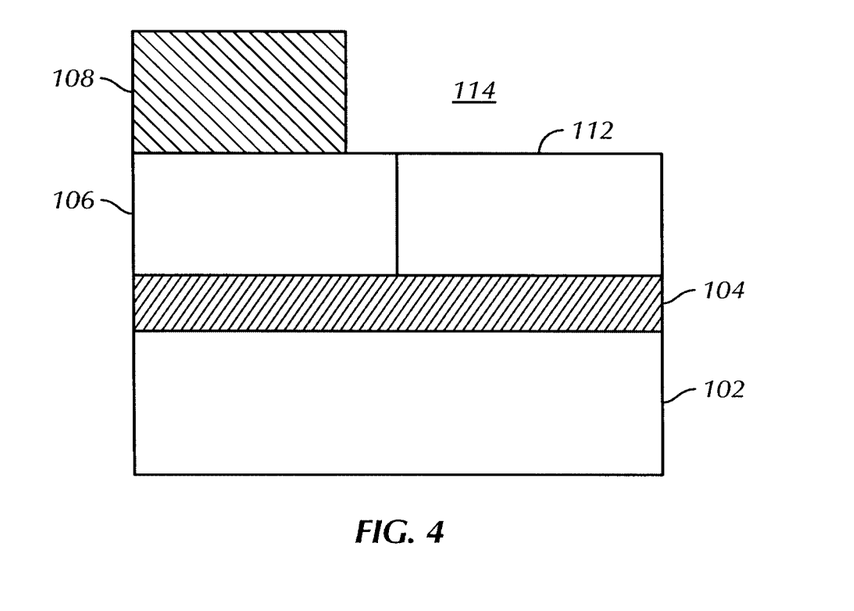

With reference to FIG. 4, pad layer 108 is pulled back for forming second trench 114. Second trench 114 includes trench 110 and, in addition, exposes SiGe layer 112 and a portion of SOI layer 106.

Figure 5:
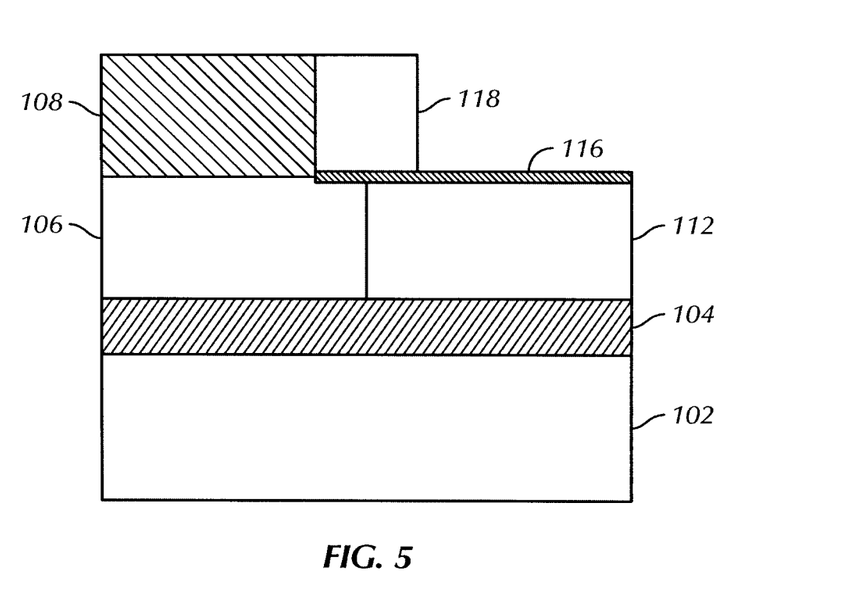

With reference to FIG. 5, a gate dielectric 116 is formed over the exposed surfaces of SiGe layer 112 and the exposed portion of SOI layer 106, using techniques well known in the art. In addition, a gate conductor 118 is formed over a portion of gate dielectric 116, using techniques well known in the art, such as, for example by deposition and RIE.

Figure 6:
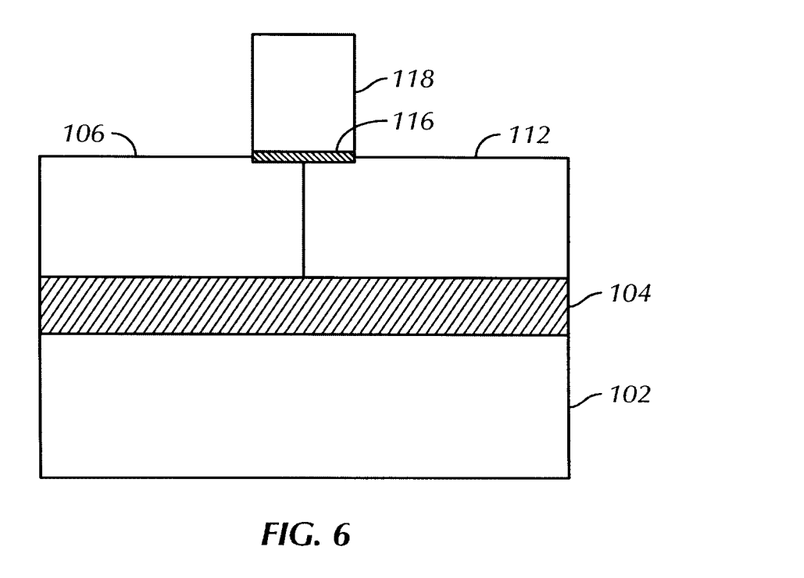
Figure 7:
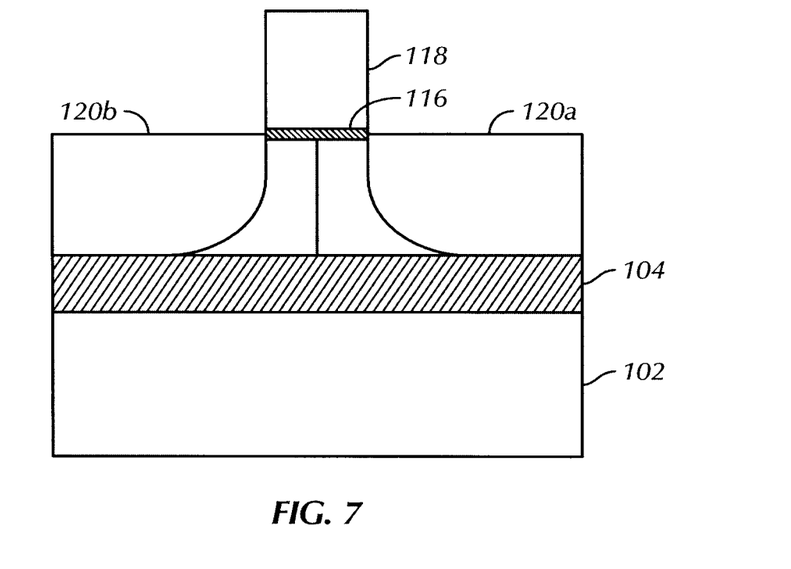

With reference to FIGS. 6 and 7, pad layer 108 is removed from the structure illustrated in FIG. 5 using known techniques. Next, source region 120a and drain region 120b are formed using conventional methods. In particular, drain region 120b is formed in at least one of the SOI layer 106 and the SiGe layer 112. In one embodiment, the source region 120a is formed in the SOI layer 106 and drain region 120b is formed in SiGe layer 112. FIG. 7 illustrates the structure in FIG. 6 with source region 120a and drain region 120b having different materials.

Figure 8:
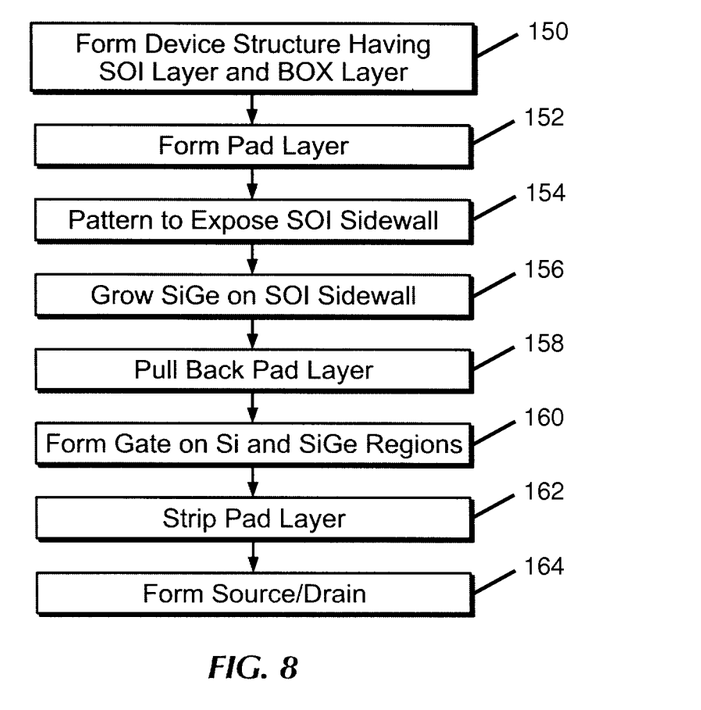
FIG. 8 is an exemplary flow diagram illustrating a method of forming a transistor having asymmetric source/drain regions, in accordance with FIGS. 1-7.
Figure 9:
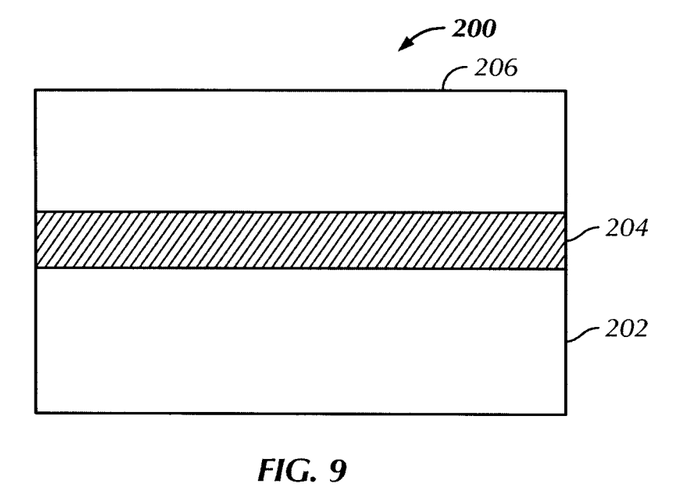
FIGS. 9-15 illustrate simplified cross-sectional views of progressive stages of a method of forming a transistor having asymmetric source/drain regions, in accordance with a second embodiment of the present disclosure.

With reference to FIG. 8, in conjunction with FIGS. 1-7, a flow diagram of an exemplary method of forming a transistor having asymmetric source/drain regions, in accordance with the present disclosure, is illustrated. Initially, at step 150, a device structure, such as, for example an SOI wafer 100 is formed having a silicon base layer 102, a BOX layer 104 and an SOI layer 106, as discussed hereinabove. In accordance with the present disclosure, at step 152, a pad layer 108 is formed over a top surface of SOI layer 106. At step 154, a trench location pattern is formed using a typical photolithographic process and trench 110 is partially etched into the device structure for exposing SOI sidewall. At step 156, SiGe is epitaxially grown on SOI 106 sidewall. At step 158, pad layer 108 is pulled back for exposing a portion of SOI layer. At step 160, a gate conductor 118 is formed on a portion of Si layer 106 and a portion of SiGe layer 112. At step 162, the remaining pad layer 108 is stripped from the structure. Finally, at step 164, source/drain portion 120a and 120b are formed.

With reference to FIGS. 9-14, a second embodiment of a structure and method of forming a transistor having asymmetric source/drain regions is described. In this particular embodiment, a channel is formed on the SOI region and on of the source/drain regions include SiGe. With initial reference to FIG. 9, an embodiment of a semiconductor-on-insulator (SOI) wafer, in accordance with the present disclosure, is illustrated and is designated generally as SOI wafer 200. a semiconductor structure 200 is illustrated. SOI wafer 200 is similar to SOI wafer 100 and will only be discussed in detail to the extent necessary to identify differences in construction and/or operation. SOI wafer 200 includes a handle substrate or base semiconductor substrate 202; a buried insulator (e.g. buried oxide (BOX)) layer 204 formed on base semiconductor substrate 202; and a SOI layer 206 formed on BOX layer 204, where BOX layer 204 isolates SOI layer 206 from base semiconductor substrate 202.

Figure 10:
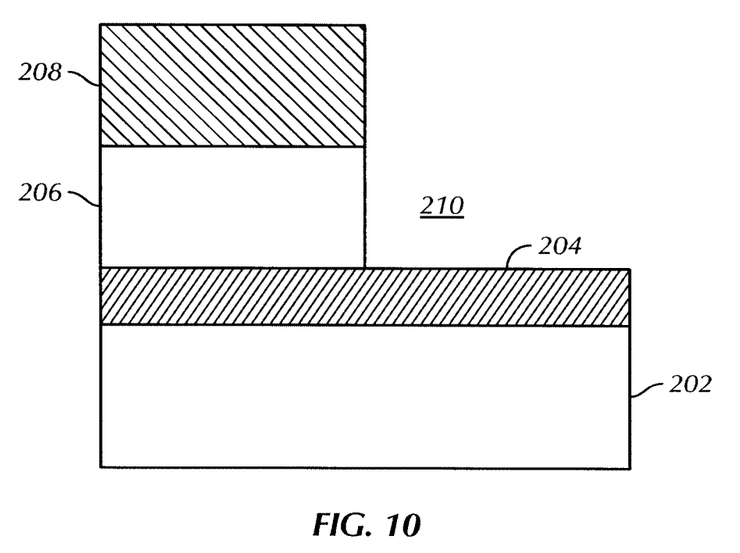

With reference to FIG. 10, a pad layer 208 is formed on a top surface of SOI layer 206. A hardmask layer (not shown) having a suitable masking material is deposited on pad layer 208 and patterned using a conventional photolithography techniques. In particular, pad layer 208 and SOI layer 206 are patterned using standard lithography steps followed by RIE for selectively etching a portion of SOI layer 206 and pad layer 208 for forming a trench 210, as shown in the figure. Trench 210 exposes a portion of BOX layer 204.

Figure 11:
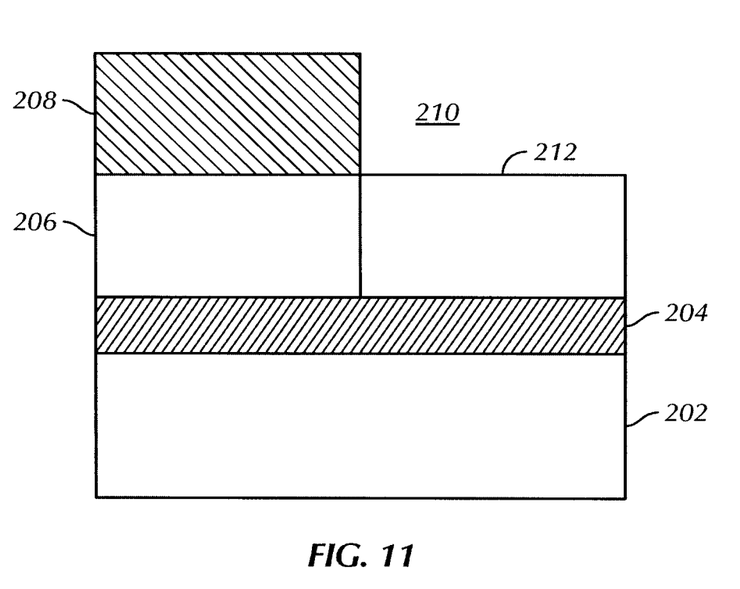

With reference to FIG. 11, a stress material (e.g. SiGe) 212 is epitaxially grown in trench 210. For example, a highly selective epitaxial SiGe layer 212, fully filling etched region 210. SiGe layer 212 may be grown to a thickness similar to that of SOI layer 206, as shown in the figure.

Figure 12:
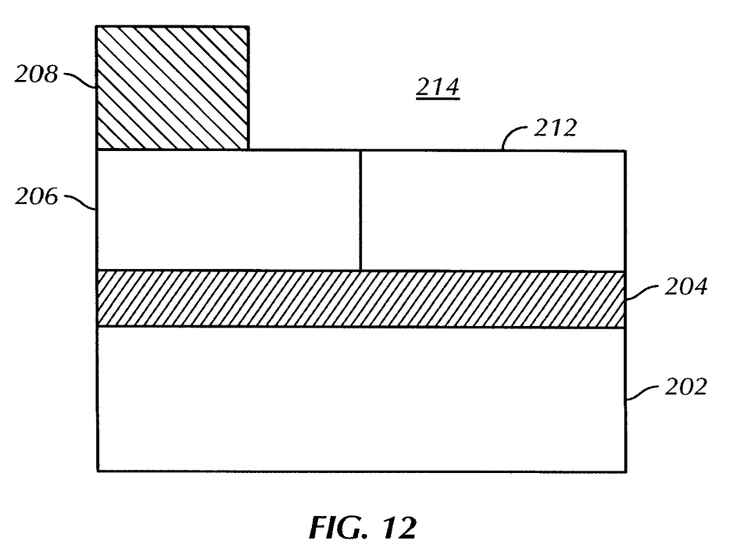

With reference to FIG. 12, pad layer 208 is pulled back for forming second trench 214. Second trench 214 includes trench 210 and, in addition, exposes a portion of SOI layer 106.

Figure 13:
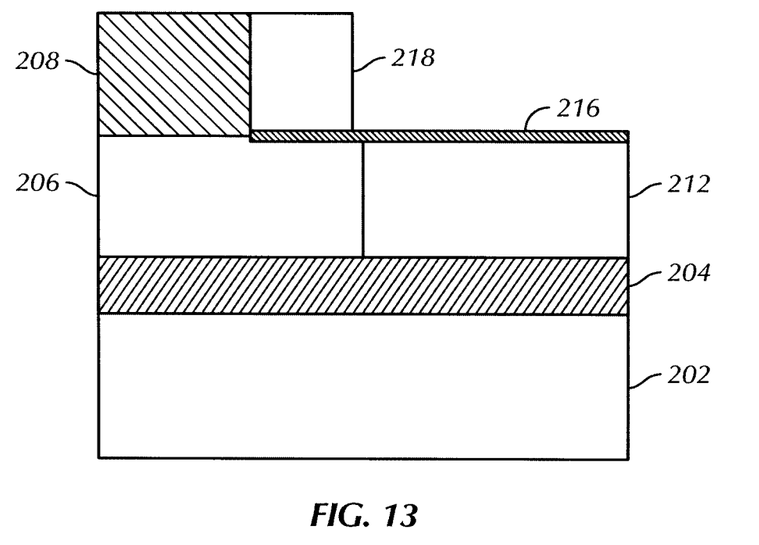

With reference to FIG. 13, a gate dielectric 216 is formed over the exposed surfaces of SOI layer 206, using techniques well known in the art. In addition, a gate conductor 218 is formed over a portion of gate dielectric 216, using techniques well known in the art, such as, for example by deposition and RIE.

Figure 14:
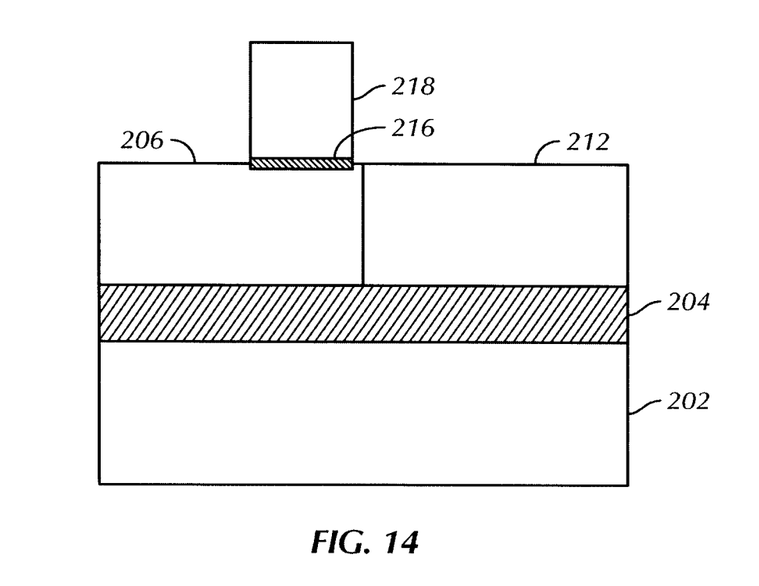
Figure 15:
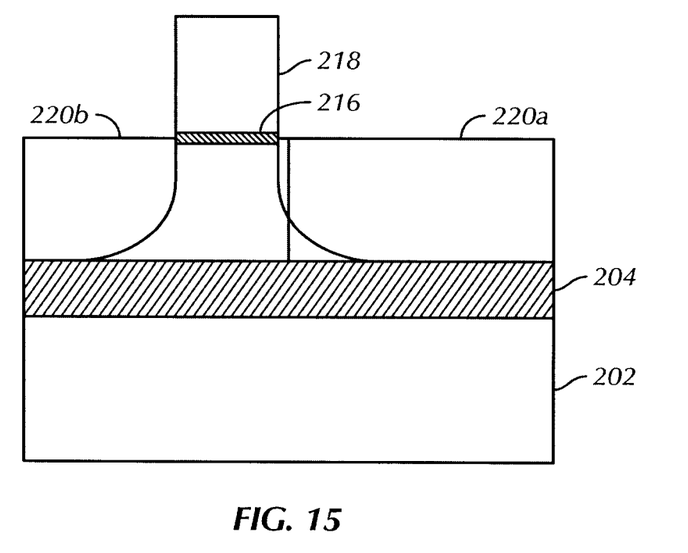

With reference to FIGS. 14 and 15, pad layer 208 is removed from the structure using know techniques. Next, source region 220a and drain region 220b are formed using conventional methods. FIG. 15 illustrate the structure in FIG. 14 with source region 220a and drain region 220b having different materials.

Figure 16:
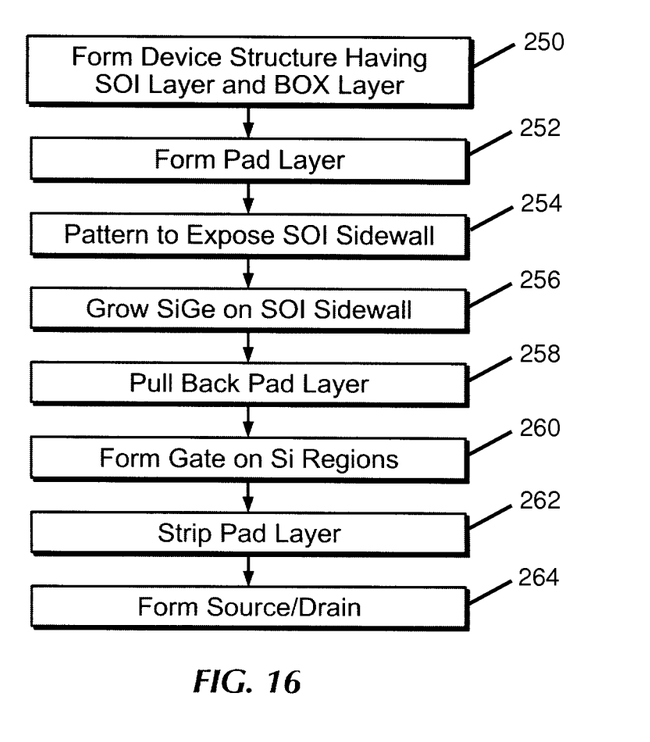
FIG. 16 is an exemplary flow diagram illustrating a method of forming a transistor having asymmetric source/drain regions, in accordance with FIGS. 9-15.

With reference to FIG. 16, in conjunction with FIGS. 8-14, a flow diagram of an exemplary method of forming a transistor having asymmetric source/drain regions, in accordance with the present disclosure, is illustrated. Initially, at step 250, a device structure, such as, for example an SOI wafer 200 is formed having a silicon base layer 202, a BOX layer 204 and an SOI layer 206, as discussed hereinabove. In accordance with the present disclosure, at step 252, a pad layer 208 is formed over a top surface of SOI layer 206. At step 254, a trench location pattern is formed using a typical photolithographic process and trench 210 is partially etched into the device structure for exposing SOI sidewall. At step 256, SiGe is epitaxially grown on SOI 206 sidewall. At step 258, pad layer 208 is pulled back for exposing a portion of SOI layer. At step 260, a gate conductor 218 is formed on a portion of Si layer 206 and a portion of SiGe layer 212. At step 262, the remaining pad layer 208 is stripped from the structure. Finally, at step 264, source/drain portion 220a and 220b are formed.

It will be understood that numerous modifications and changes in form and detail may be made to the embodiments of the presently disclosed structure and method of forming a transistor having asymmetric source/drain. It is contemplated that numerous other configuration of the interconnect structure may be formed, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A semiconductor structure comprising:
   a channel region within a semiconductor substrate, the channel region comprising a first material and a second material, the first material having a different lattice constant than the second material;
   a gate conductor above the channel region; and
   a source region and a drain region associated with the gate conductor, at least a portion of the source region comprising the first material and at least a portion of the drain region comprising the second material.

2. The semiconductor structure of claim 1, wherein the first material includes a SOT layer and the second material includes a SiGe layer.

3. The semiconductor structure of claim 1, wherein the first material includes a SiGe layer and the second material includes a SOI layer.

4. The semiconductor structure of claim 1, wherein the first material and the second material are selected from a group consisting of Si, SiGe and a combination thereof.

5. The semiconductor structure of claim 1, wherein the source region and the drain region are self-aligned to the gate conductor and the channel region extends from the source region to the drain region.

6. The semiconductor structure of claim 1, further comprising:
   a gate dielectric separating the gate conductor from the channel region.

7. The semiconductor structure of claim 1, wherein the channel region is asymmetrical in profile between the source region and the drain region.

8. The semiconductor structure of claim 1, wherein said semiconductor substrate includes a semiconductor-on-insulator (SOI) layer, a buried insulating (BOX) layer and base substrate layer.

9. An asymmetric transistor formed in a semiconductor substrate having a semiconductor-on-insulator (SOI) layer, a buried insulating (BOX) layer and a base substrate layer, the asymmetric transistor comprising:
   a silicon-germanium layer adjacent to a portion of the SOI layer;
   a channel region within the SOI layer and within the silicon-germanium layer, the channel region being associated with the asymmetric transistor;
   a conductive gate above the channel region; and
   a source region and a drain region on opposite sides of the channel region, at least a portion of the source region comprising at least one of the SOI layer and the SiGe layer, and at least a portion of the drain region comprising at least one of the SOI layer and the SiGe layer,
   wherein the source region and the drain region are self-aligned to the conductive gate, and the channel region extends from the source region to the drain region.

10. The asymmetric transistor of claim 9, further comprising:
    a gate insulator, the gate insulator separating the channel region channel region from the conductive gate.

11. The asymmetric transistor of claim 9, wherein the source region is formed in the SOI layer and the drain region is formed in the SiGe layer.

12. The asymmetric transistor of claim 9, wherein the source region is formed in the SiGe layer and the drain region is formed in the SOI layer.

13. The asymmetric transistor of claim 9, wherein the source region and the drain region each include a material selected from a group consisting of Si, SiGe and a combination thereof.

14. A semiconductor device comprising:
    a channel within a semiconductor substrate, the channel comprising a first material;
    a metal gate above the channel; and
    a source region and a drain region located within the semiconductor substrate on opposite sides of the channel, at least a portion of the drain region comprising the first material, at least a portion of the source region comprising the first material, and at least a portion of the source region comprising a second material, the first material having a different lattice constant than the second material.

15. The semiconductor device of claim 14, wherein said first material includes Si and said second material includes SiGe.

16. The semiconductor device of claim 14, wherein the first material includes SiGe and the second material includes Si.

17. The semiconductor device of claim 14, wherein the first material and the second material are selected from a group consisting of Si, SiGe and a combination thereof.

18. The semiconductor device of claim 14, wherein the source region and the drain region are self-aligned to the metal gate and the channel region extends from the source region to the drain region.

19. A method of forming a semiconductor device formed over a semiconductor substrate, the method comprising:
   epitaxially growing a SiGe layer in a portion of a semiconductor-on-insulator (SOI) layer of said semiconductor substrate; and
   forming a transistor over said SOI layer, wherein said forming of said transistor includes:
   forming a channel region in a first portion of said SOI layer;
   forming a metal gate above said channel region; and
   forming a source region and a drain region formed between said channel region; wherein said source region is formed in at least one of said SOI layer and said SiGe layer; and further wherein said drain region is formed in at least one of said SOI layer and said SiGe.

20. The method recited in claim 19, wherein said source region is formed in said SOI layer and said drain region is formed in said SiGe layer.

21. The method recited in claim 19, wherein said source region is formed in said SiGe layer and said drain region is formed in said SOI layer.

22. The method of claim 14, further comprising:
   a gate dielectric separating the metal gate from the channel region.

* * * * *